United States Patent [19]

Hardee et al.

[11] Patent Number: 5,077,693

[45] Date of Patent: Dec. 31, 1991

[54] DYNAMIC RANDOM ACCESS MEMORY

[75] Inventors: Kim C. Hardee; David B. Chapman, both of Austin, Tex.; Juan Pineda, San Francisco, Calif.

[73] Assignee: Motorola, Inc., Schaumburg, Ill.

[21] Appl. No.: 563,167

[22] Filed: Aug. 1, 1990

[51] Int. Cl.[5] .............................................. G11C 13/00
[52] U.S. Cl. .......................... 365/230.08; 365/233 A
[58] Field of Search ...................... 365/189.04, 230.08, 365/233, 189.05

[56] References Cited

U.S. PATENT DOCUMENTS

| | | | |
|---|---|---|---|
| 4,649,511 | 3/1987 | Gdula | 364/900 |
| 4,710,902 | 12/1987 | Pelley, III et al. | 365/222 |
| 4,734,880 | 3/1988 | Collins | 364/900 |
| 4,740,921 | 4/1988 | Lewandowski et al. | 365/189 |
| 4,754,425 | 6/1988 | Bhadriraju | 364/900 |
| 4,823,322 | 4/1989 | Miyatake et al. | 365/190 |
| 4,831,597 | 5/1989 | Fuse | 365/233 |

OTHER PUBLICATIONS

Motorola Semiconductor Technical Data, MCM514256A, 1988.

*Primary Examiner*—Terrell W. Fears
*Attorney, Agent, or Firm*—James L. Clingan; Ray Warren

[57] ABSTRACT

A DRAM is operated based upon an external clock input, a column enable, and a row enable. The DRAM is accessed and row and column addresses are latched into buffers based upon the clock input.

13 Claims, 10 Drawing Sheets

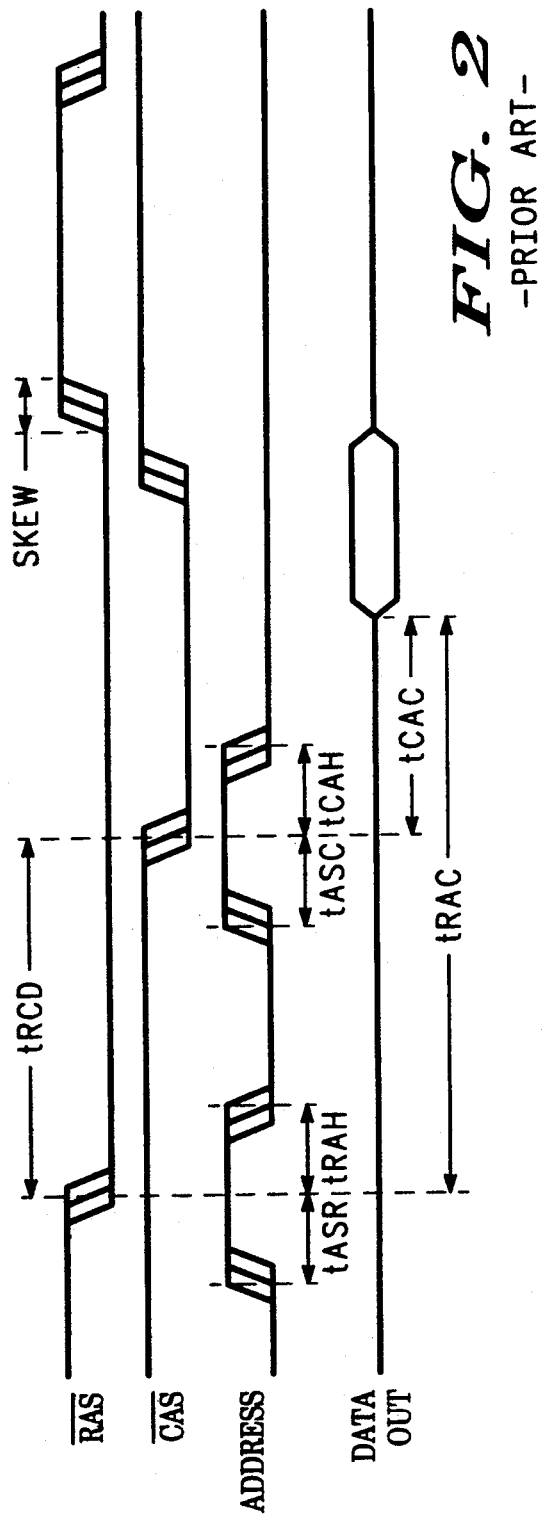
FIG. 2 -PRIOR ART-
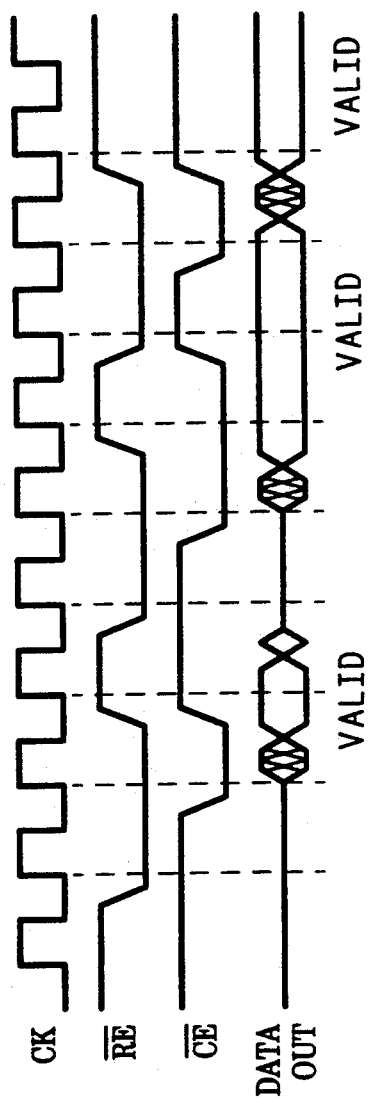
FIG. 5

DYNAMIC RANDOM ACCESS MEMORY

BACKGROUND OF THE INVENTION

The present invention relates, in general, to dynamic random access memories (DRAMs) and, more particularly, to a DRAM having synchronized control timing.

Various types of DRAMs are known in the industry. Access to the DRAM (reading and writing information) is generally controlled by a DRAM Controller. When access is to be made, the controller sends a Row Address Strobe (RAS) and a Column Address Strobe (CAS) to select the particular bit that is to be accessed. The timing of the controller output is based on the input from a system clock.

As DRAM speeds increase, it is becoming more difficult for memory system designers to use the available speed due to problems related to generating the necessary timing signals. This is particularly true of page mode cycle times (where several column addresses are sequentially provided for a single row address).

In a computer system, there is a system clock which is used to clock the processor and other peripheral circuitry which in turn generate the necessary timing signals for the memory system. Since the timing signals to the DRAM are processed through other logic devices prior to reaching the DRAM, the resulting signals will have delays (skews) with respect to other signals and the system clock. Further, these skews will be different for each signal since the signals are processed through different circuitry. Because of these skews, designers must allow for extra time in the signal lengths. The result of having to add 6-8 ns to a 40 ns signal is quite substantial.

Therefore, there exists a need in the industry for a memory system that will reduce or eliminate the skew associated with processing of timing signals.

Accordingly, it is an objective of the present invention to provide a DRAM which overcomes the above deficiencies.

Another object of the present invention is to reduce the skew associated with the row and column address strobes ($\overline{RAS}$ and $\overline{CAS}$).

Still another object of the present invention is to provide a DRAM having synchronized control timing.

Yet another object of the present invention is to provide a DRAM having control timing synchronized with a clock input.

SUMMARY OF THE INVENTION

A particular embodiment of the present invention consists of a DRAM having a clock input, a column enable, and a row enable. In operation, the DRAM is accessed and row and column addresses are latched based on the clock input.

BRIEF DESCRIPTION OF THE DRAWINGS

FIG. 2 is a timing diagram of the prior art DRAM of FIG. 1.

DETAILED DESCRIPTION OF THE DRAWINGS

Figure 1:
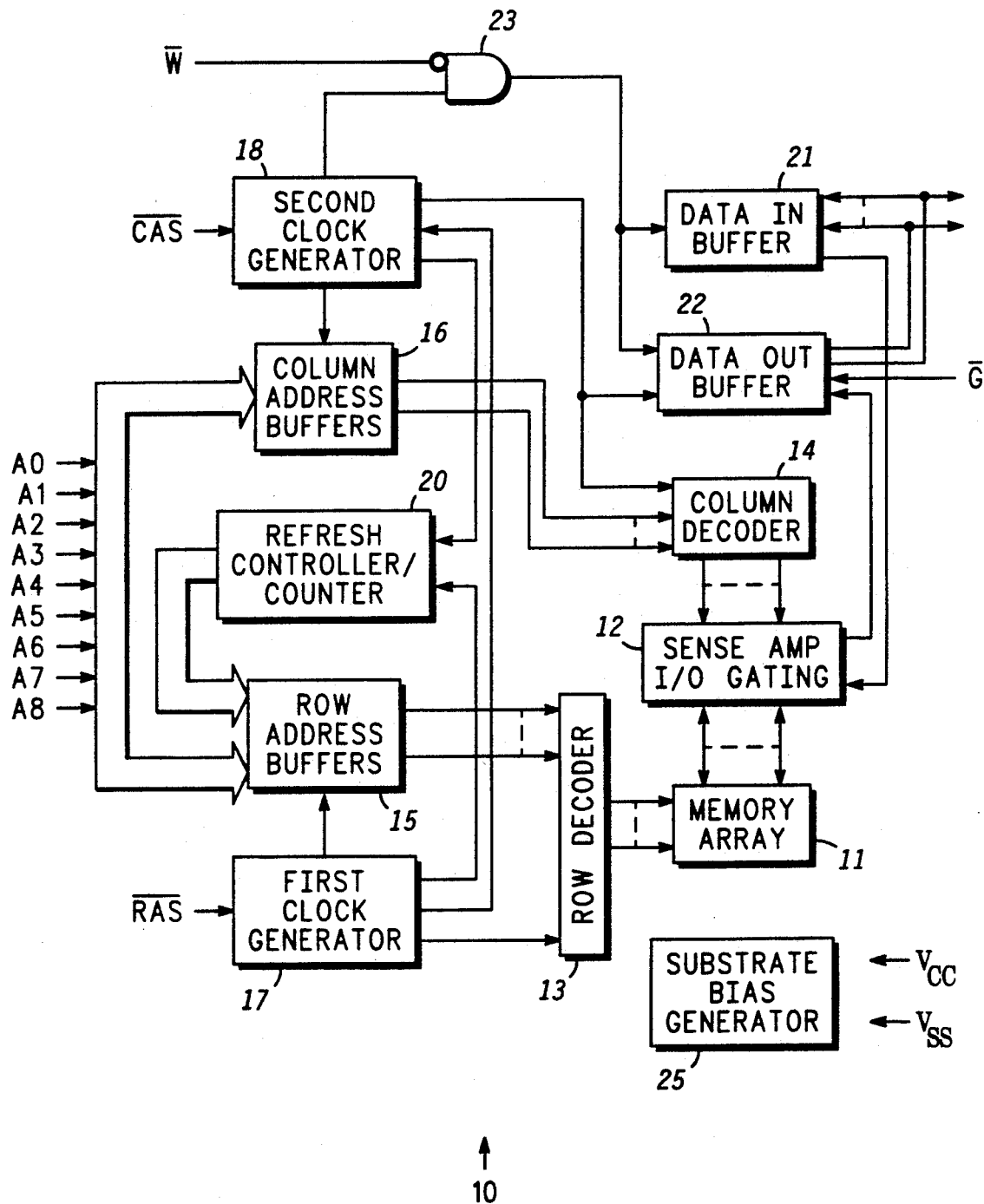
FIG. 1 is a block diagram of a prior art DRAM.

Referring to the block diagram of FIG. 1, a prior art DRAM, generally designated 10, is illustrated. DRAM 10 consists of a memory array 11 which is comprised of a matrix of memory cells. A bit line sense amplifier and input/output gating circuit 12 is a series of sense amplifiers coupled between a bit line pair of memory array 11 and an input/output line pair to amplify the memory cell output.

Row and column decoders 13 and 14, respectively, are coupled to memory array 11 to decode the row and column address of the cell being accessed Row and column address buffers 15 and 16, respectively, are coupled to the address input lines (A0-A8) and to row and column decoders 13 and 14. Buffers serve to store the address signals.

First and second clock generators 17 and 18 are coupled to the Row Access Strobe ($\overline{RAS}$) and Column Access Strobe ($\overline{CAS}$) inputs. These inputs control the operation of the clocks which in turn control the operation of the row and column buffers and decoders (13-16).

Since dynamic memories are volatile and can loose data if not accessed or refreshed on a regular basis, a refresh controller/counter 20 is provided to refresh the memory array 11. Data In and Data Out buffers 21 and 22 are provided to store data that is being written to or read from memory array 11. Buffers 21 and 22 are controlled by a write enable ($\overline{W}$), through an AND gate 23 and an output enable ($\overline{G}$). A substrate bias generator 25 is provided coupled to a power line ($V_{CC}$) and ground ($V_{SS}$).

A problem with the existing DRAMs is the delays caused in signal processing due to propagation delays in the various circuits. An example of this is illustrated in FIG. 2, a timing diagram for the prior art DRAM of FIG. 1. FIG. 2 illustrates timing lines for $\overline{RAS}$, $\overline{CAS}$, the address, and the data output. The timing figures are as follows:

| SIGNAL | DESCRIPTION | MIN | MAX |
| --- | --- | --- | --- |
| $t_{RCD}$ | $\overline{RAS}$ and $\overline{CAS}$ Delay | 20 ns | 50 ns |
| $t_{ASR}$ | Row Address Setup | 0 ns | — |
| $t_{RAH}$ | Row Address Hold | 10 ns | — |
| $t_{ASC}$ | Column Address Setup | 0 ns | — |
| $t_{CAH}$ | Column Address Hold | 15 ns | — |
| $t_{RAC}$ | Access Time For $\overline{RAS}$ | — | 70 ns |
| $t_{CAC}$ | Access Time For $\overline{CAS}$ | — | 20 ns |

The system clock drives the processor which provides control signals to the DRAM controller which in turn generates the $\overline{RAS}$ and $\overline{CAS}$ signals. The processing of these signals through the various circuitry results in skews which must be accounted for by the system designer. This results in a memory system that is not operating as fast as the DRAM data sheet indicates.

As can be seen in FIG. 2, none of the timing lines are referenced to the clock. In addition, the signal skews, which are additive, have an adverse effect on the specifications. As the magnitude of the AC specifications decreases in faster DRAMs, the signal skews become a more substantial part of a cycle time. As an example, the minimum Row Address Hold ($t_{RAH}$) set out in the table above is 10ns. Without a skew of 2-4 ns, this time could be reduced to as little as 6ns, a 40% reduction in hold time. Similar time savings can be seen in other timing areas.

Figure 3:
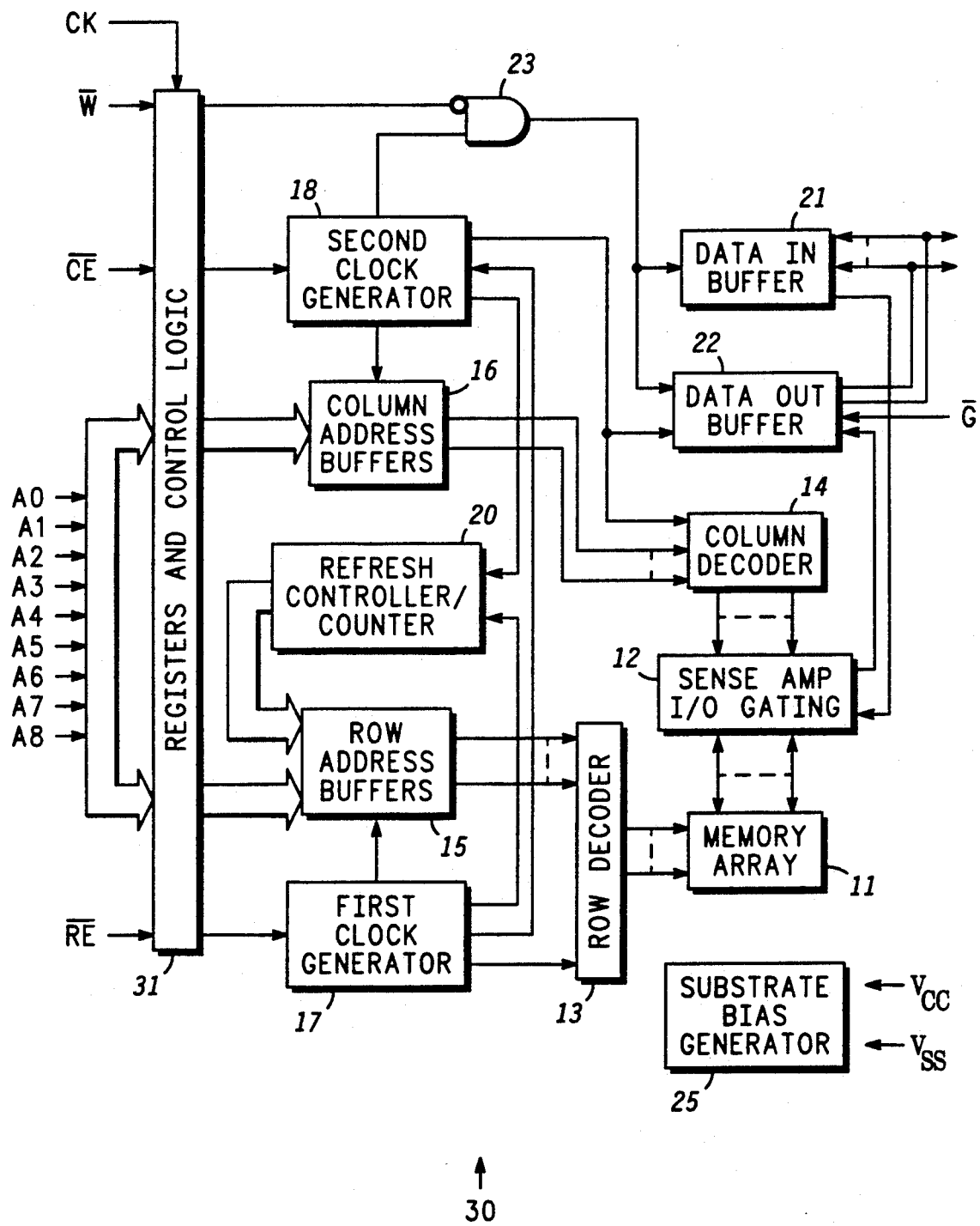
FIG. 3 is a block diagram of DRAM embodying the present invention;
FIG'S 4A-4E are circuit diagrams of the registers and control logic of FIG. 3; and
FIG'S 5-10 are timing diagrams of the DRAM of FIG. 3.

Referring now to FIG. 3, a block diagram of a DRAM, generally designated 30, embodying the present invention is illustrated. In FIG. 3, the same numbers as used in FIG. 1 are used to designate like components. The main difference between FIGS. 1 and 3 is the use of row and column enables, $\overline{RE}$ and $\overline{CE}$, in place of $\overline{RAS}$ and $\overline{CAS}$, and a system clock input (CK). In addition, further registers and control logic 31 are provided.

Figure 4A:
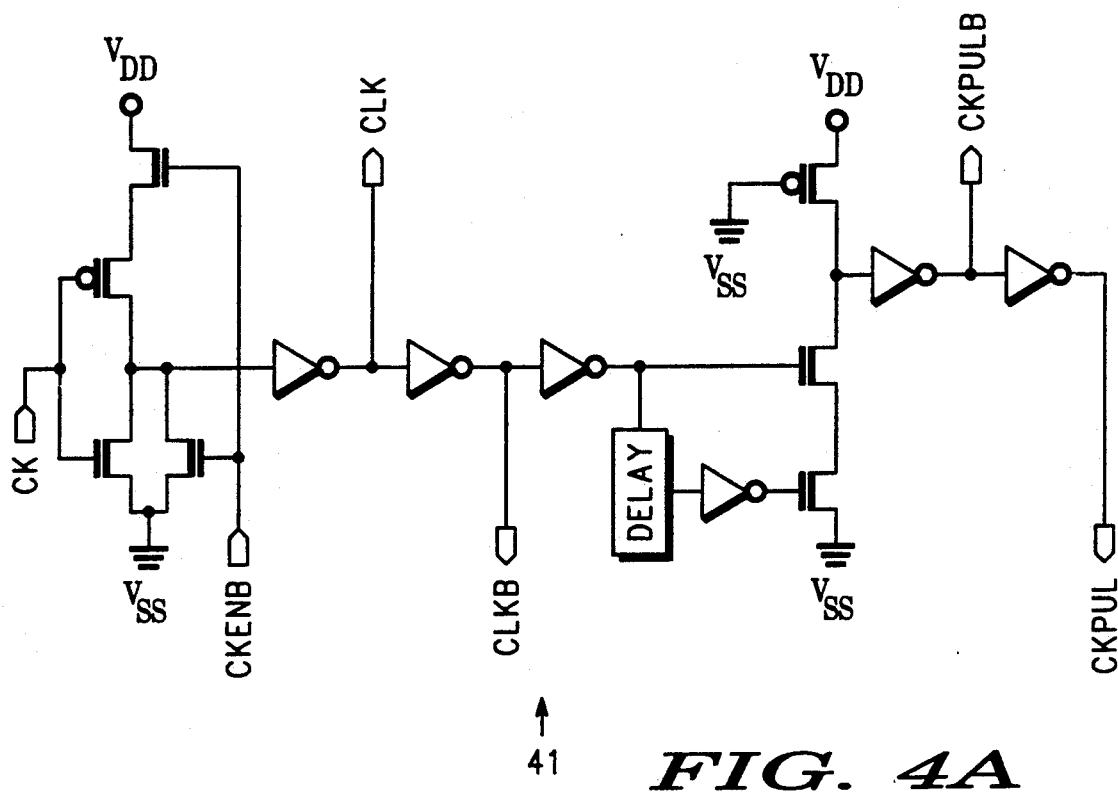

Various portions of logic 41 are illustrated in FIG'S 4A-4E. FIG. 4A illustrates a clock buffer 40 which receives the external clock signal (CK) and generates internal trap (CLK/CLKB) and latch (CKPUL/CKPULB) signals. The input buffer of clock chain 40 is a TTL compatible ratioed inverter which is enabled by a clock enable (CKENB) signal. The clock enable signal is a power-down option which reduces standby current and chip noise generated by the external clock.

Figure 4B:
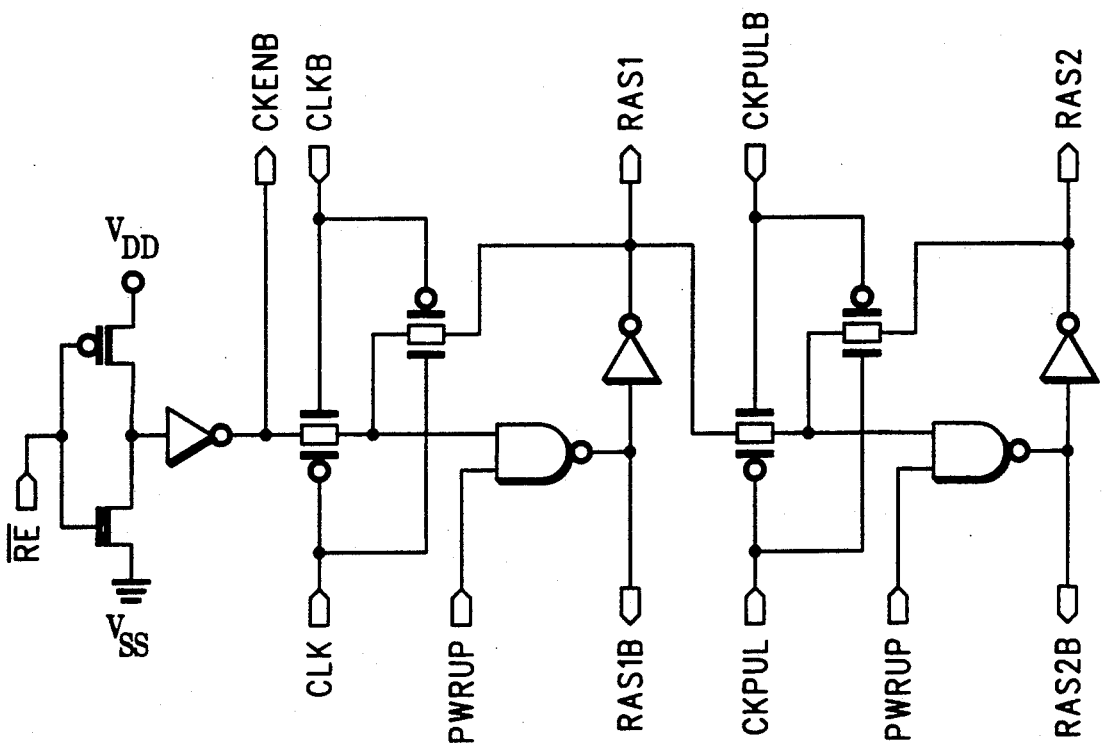
Figure 4C:
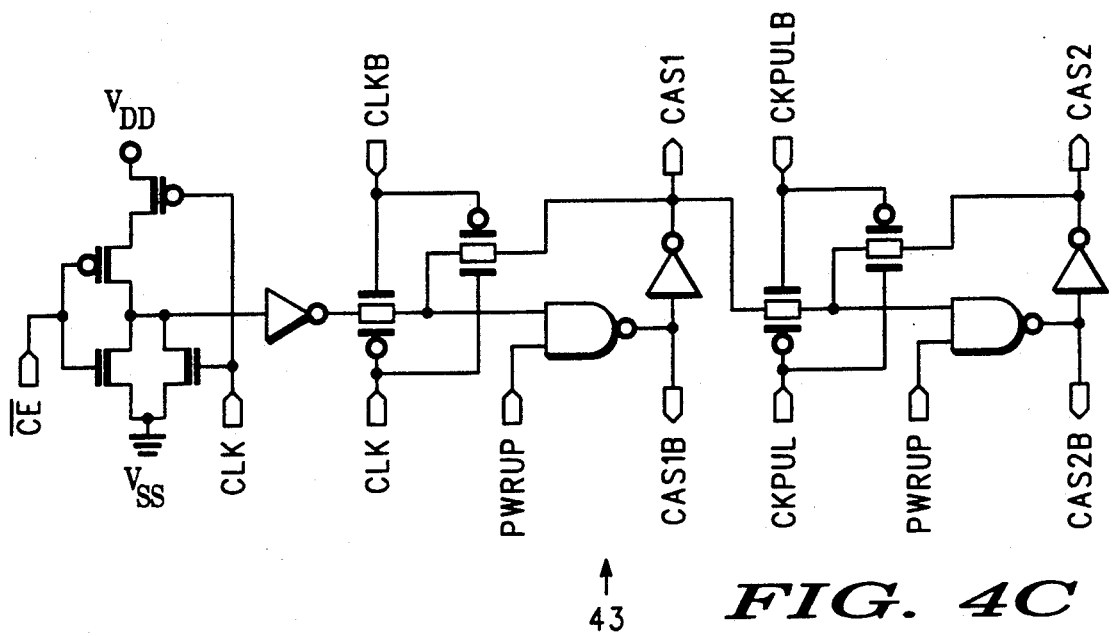
Figure 4D:
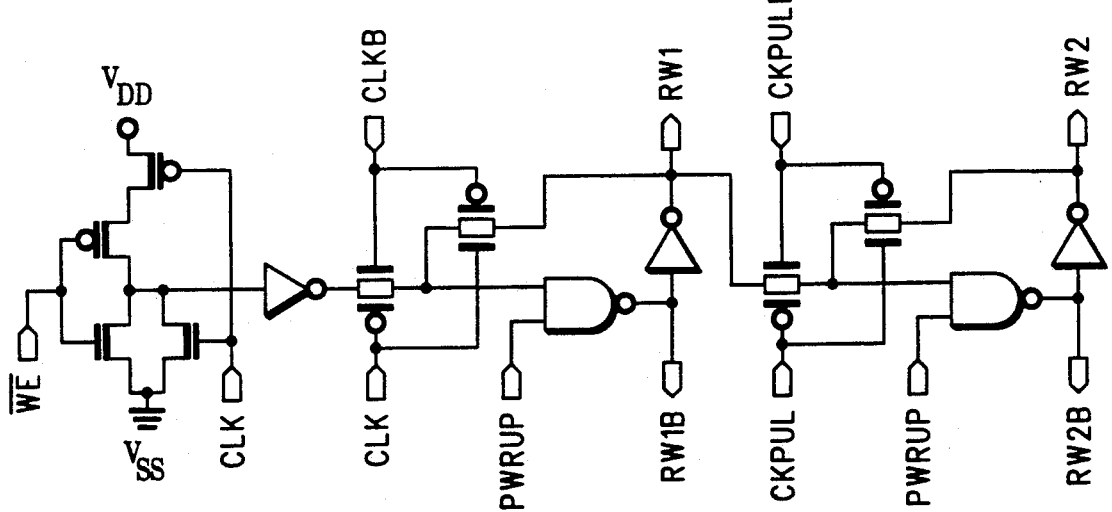

FIG. 4B illustrates an $\overline{RE}$ latch 42 which, in a synchronized mode, will replace the $\overline{RAS}$ buffer. Latch 42 consists of a TTL compatible ratioed inverter and two inverter-latches. When the external clock goes high, the CLK and CLKB signals will trap the data in the first inverter-latch to meet setup and hold specs. Subsequently, the CKPUL and CKPULB pulses are generated to allow trapped data to be stored in the second inverter-latch. FIG'S 4C and 4D, $\overline{CE}$ and $\overline{W}$ latches 43 and 44 are illustrated. As shown, latches 43 and 44 are similar to latch 42 except for the input signal.

Figure 4E:
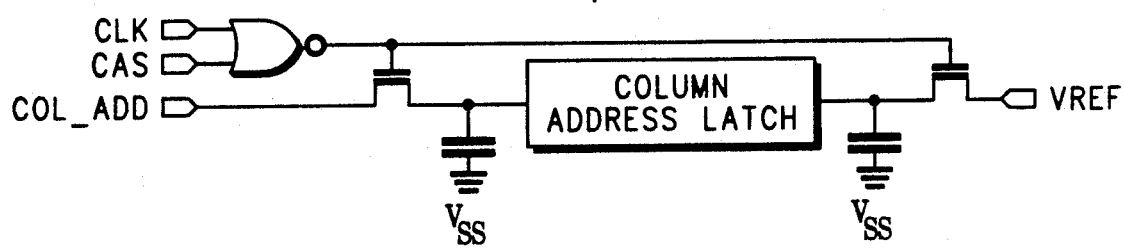

FIG. 4E illustrates a modified column address buffer 45 in which is a pair of N-channel pass devices and capacitors have been added to the column address buffers. In fast page and static column modes, the pass transistors are "on" when the external clock and $\overline{CE}$ are low to allow new column addresses to be loaded. This will initiate the $\overline{CE}$ chain.

The timing diagram associated with DRAM 30 is illustrated in FIG. 5. Here, the reading and latching of row and column addresses is accomplished on the clock signal. In this example the rising edge of the clock signal is used. By coordinating timing of the various input and output signals to the clock, there is no need to compensate for skews. This permits DRAMs to operate in a faster, more efficient manner.

Specifically, the active cycle begins with $\overline{RE}$ being low and remaining low for a hold time after CK goes high. This is equivalent to the $\overline{RAS}$ going low for the standard DRAM. Following a precharge, the row addresses are latched on the first occurrence of $\overline{RE}$ being low during a rising edge of a clock signal.

Next, if $\overline{CE}$ is set low during a subsequent rising edge of the CK signal, the column address is latched into the column address buffer. If $\overline{W}$ was low, then a write operation is performed. If $\overline{W}$ was high during this CK signal, then a read operation occurs and data-out will become valid an access time later.

If $\overline{CE}$ is set high on the subsequent rising edge of the CK signal, then the page cycle is extended as if the CK edge did not occur. If $\overline{W}$ remains high during this time, then a fast page mode read is conducted. This is illustrated in the timing diagram of FIG. 6. After a precharge, the row address is latched in on the first rising edge. Next, the first column address is latched in and the memory cell corresponding to that row and column address is read. In the next clock cycle, $\overline{RE}$ remains low and $\overline{CE}$ is low, but a different column address is provided. This new column address is latched and the data for that memory cell is read. This process can continue until $\overline{RE}$ goes high.

Figure 6:
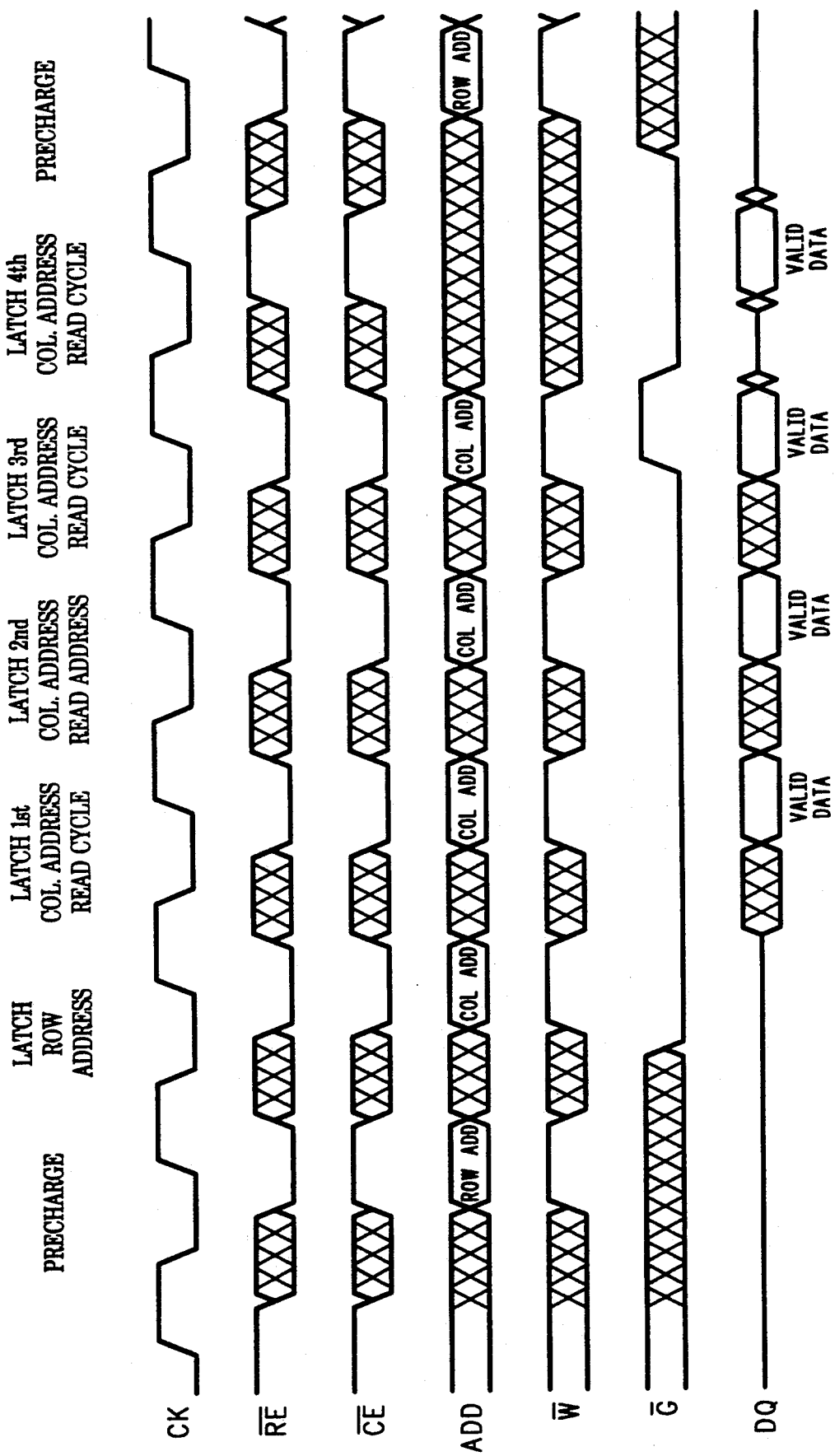

In FIG. 6, if $\overline{W}$ were to remain low, the system would write data into designated columns on each clock pulse rather than read data.

Figure 7:
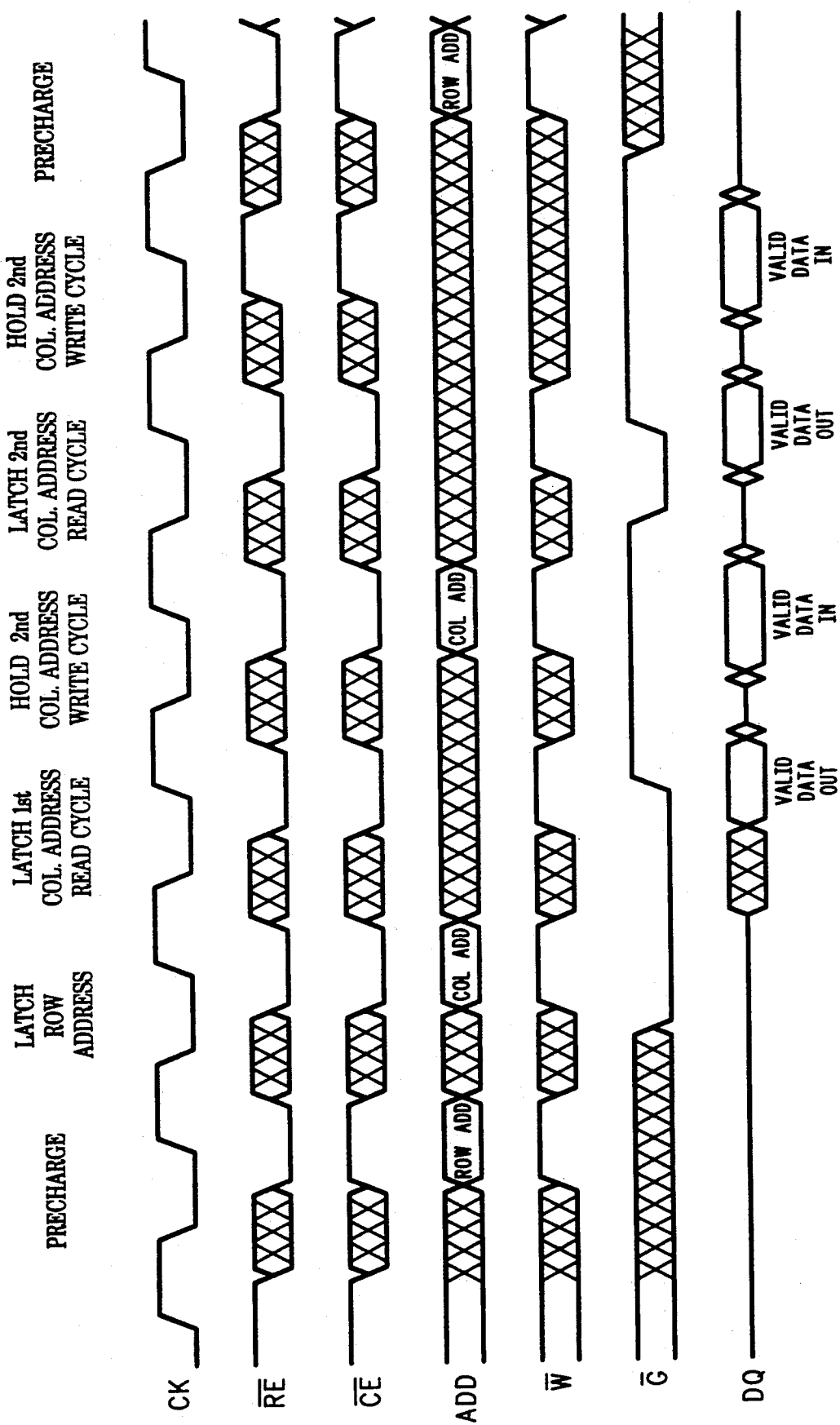

Referring now to FIG. 7, a fast page mode read-modify-write cycle is illustrated. Following a precharge, the row address is latched in on the first rising edge of the CK pulse. Next, the first column address is latched and the memory cell corresponding to that row and column address is accessed. Since the first step is to read, $\overline{W}$ must be high on this CK. Following the read, $\overline{CE}$ goes high and $\overline{W}$ goes low. This keeps the same column address latched in the column address buffers and causes a write to occur into this address. This can be repeated for other column addresses on the same page. During the read portion, $\overline{G}$ is kept low and during the write portion $\overline{G}$ is high allowing data in and out of the data buffers.

Figure 8:
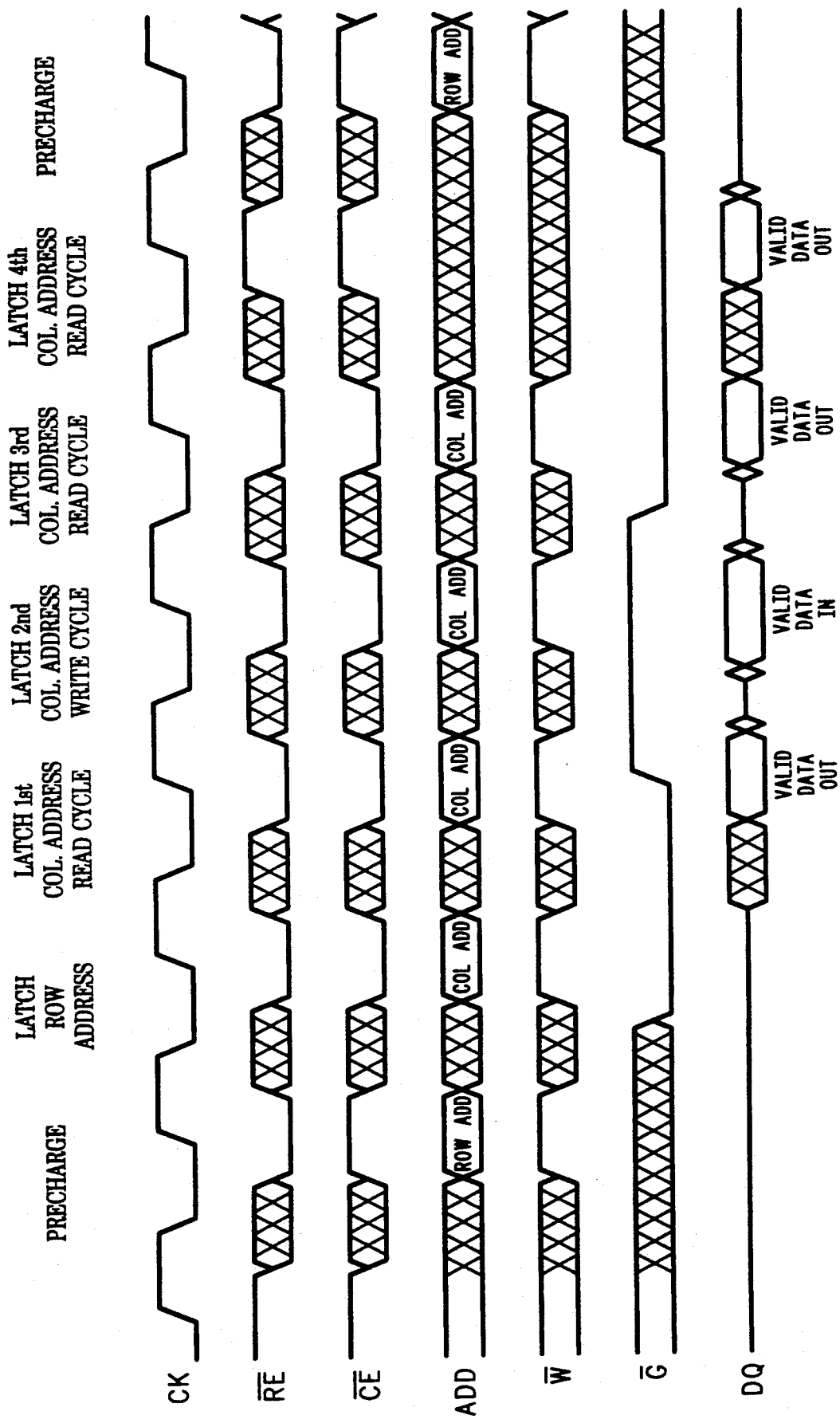

A variation of the example in FIG. 7 is a fast page mode read/write cycle illustrated in FIG. 8. The main difference, is that the column being written to does not have to be the came as the column just read. This is accomplished by keeping $\overline{CE}$ low while $\overline{W}$ is toggled between read and write. Since $\overline{CE}$ is low, the address is locked into the column address buffer on each CK. Then, depending on the state of $\overline{W}$, data is either read out of or written to the appropriate memory cell to the data buffers. The $\overline{G}$ signal then regulates the flow of data from the data buffers to a data bus.

The precharge shown at the beginning of the cycles illustrated in FIGS. 6-8 is initiated with $\overline{RE}$ high on a rising CK edge. If $\overline{CE}$ is also high on this transition, the outputs will be tri-stated. If $\overline{CE}$ is low then the outputs will remain valid. The precharge may be extended by keeping $\overline{RE}$ high on subsequent rising CK edges. A new active cycle will begin upon the first occurrence of $\overline{RE}$ low in a rising CK edge.

Figure 9:
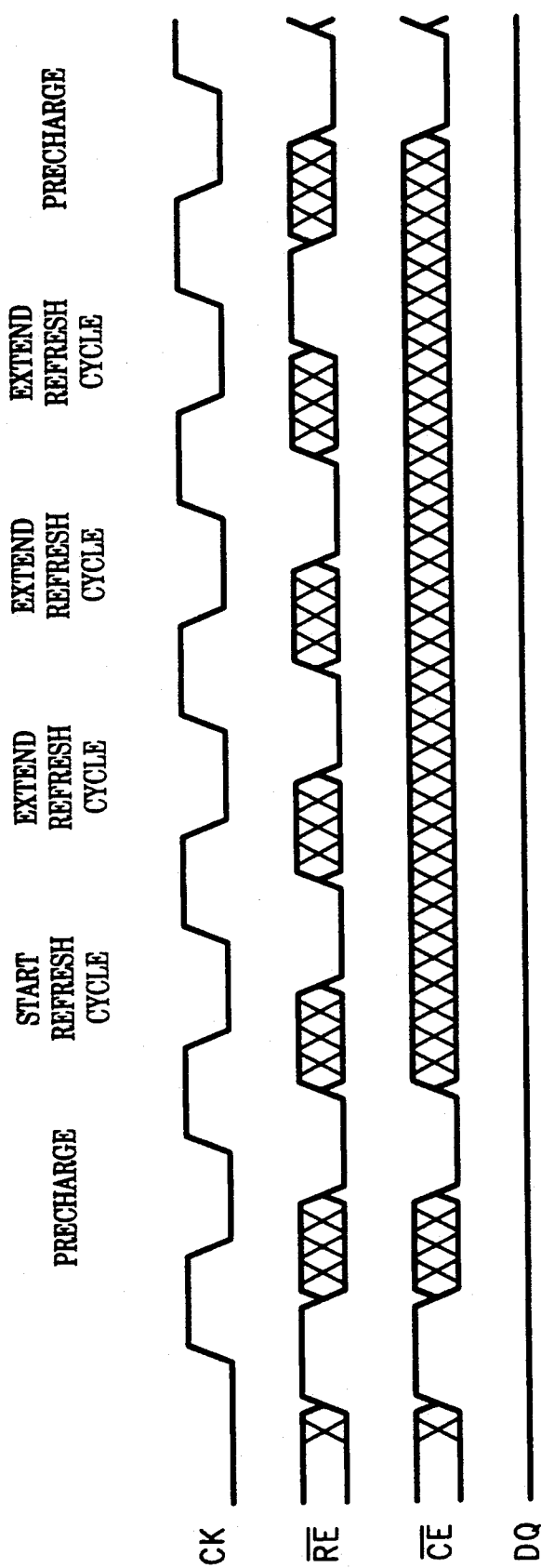

In the prior art, there is a refresh cycle referred to as CAS before $\overline{RAS}$ refresh cycle. This can also be performed in the present invention as illustrated in FIG. 9. If both $\overline{RE}$ and $\overline{CE}$ are low on the first CK edge after precharge, then the refresh cycle will be started. This refresh cycle will continue as long as $\overline{RE}$ remains low.

Figure 10:
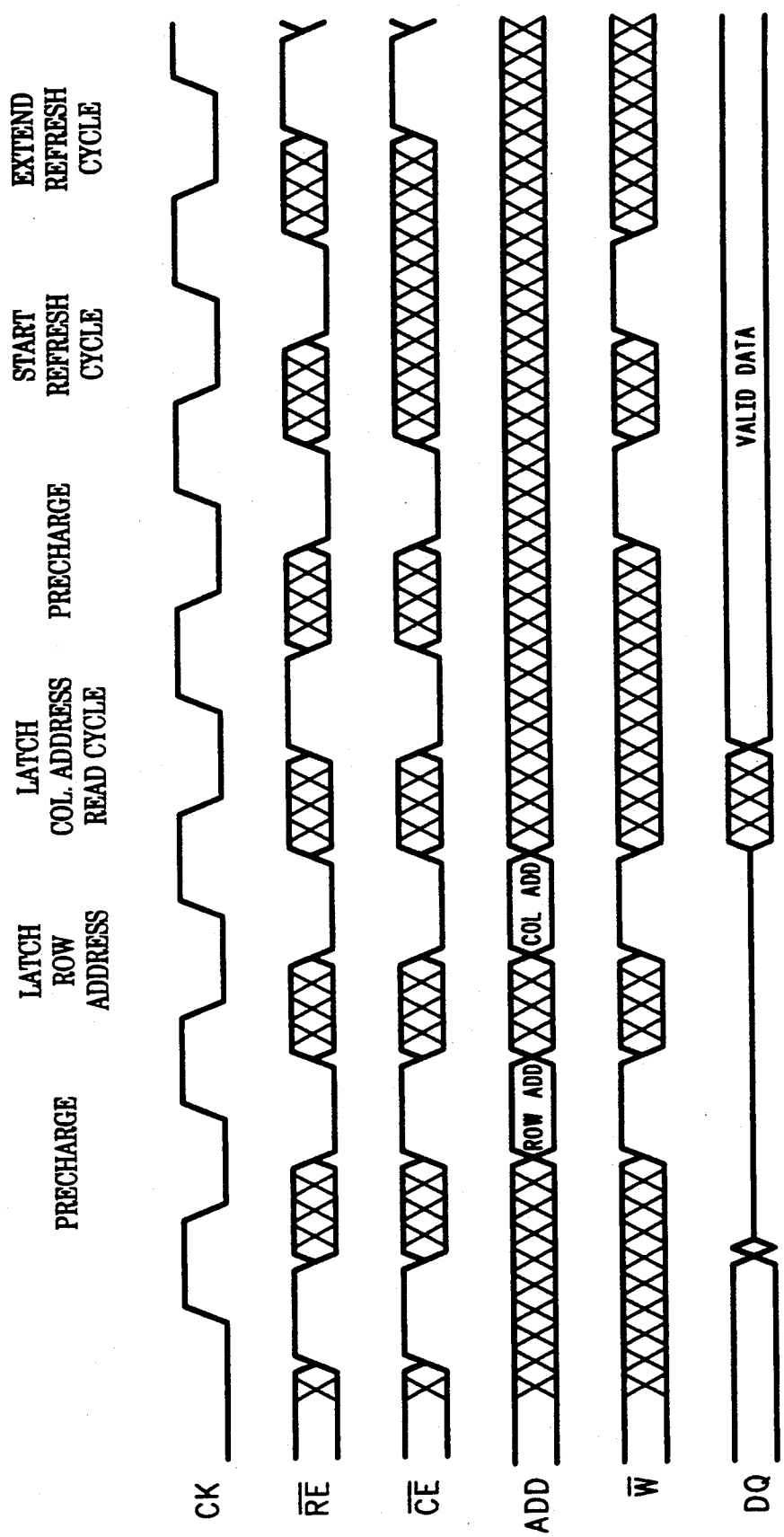

Another method of refreshing the memory is referred to as a hidden refresh cycle, illustrated in FIG. 10. This occurs when, at the end of a read cycle, $\overline{RE}$ goes high while $\overline{CE}$ stays low. At this point, a precharge is conducted. Then, when $\overline{RE}$ goes low again, both $\overline{RE}$ and $\overline{CE}$ are low putting the system into a refresh cycle.

It should be noted that while the above description synchronized the timing diagrams to the rising edge of the CK signal, this could also be set to the trailing edge of the CK signal. In addition, while some of the events need to be synchronized to the CK signal, some of the signals could be asynchronous. For example, $\overline{RE}$ going high could be asynchronous while $\overline{RE}$ going low could be synchronized.

One potential disadvantage to the present invention is the added power due to the CK input toggling. One way in which this drawback can be minimized is to inhibit, or power-down, the CK input. This would occur by powering down the CK signal when $\overline{RE}$ is high at the beginning of a precharge. The CK would then stay low until $\overline{RE}$ goes low.

Therefore, as stated above, the present invention provides a DRAM having synchronized control timing for reducing the skew associated with the row and column address strobes.

Thus, it will be apparent to one skilled in the art that there has been provided in accordance with the invention, a process and method that fully satisfy the objects, aims, and advantages set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

We claim:

1. A dynamic random access memory comprising: a plurality of bit lines;
   a plurality of word lines intersecting said plurality of bit lines;
   a plurality of refreshable memory cells located at respective intersections of said bit lines and said word lines, each of said memory cells providing a signal to its respective bit line indicative of data stored therein in response to its respective word line being enabled;
   address input means for sequentially receiving a row address and a column address, providing said row address as an output in response to an edge of an external clock signal while a row enable signal is in a first state and a column enable signal is in a second state, and providing said column address as an output in response to said column enable signal being in said first state on a sequential edge of said external clock signal;
   row decoder means for enabling a selected word line in response to receiving said row address from said address input means;
   a plurality of sense amplifiers, coupled to respective bit lines, each of said sense amplifiers provided to amplify said signal on said respective bit line provided by said memory cell coupled to said respective bit line and said enabled word line;
   column decoder means for coupling a selected bit line to a common data line in response to receiving said column address signal from said address input means and for decoupling said selected bit line from said common data line when said row enable and said column enable signals are both in said second state on an edge of said external clock signal;
   a secondary sense amplifier coupled to said common data line for amplifying said signal coupled to said common data line from said selected bit line and for providing an output indicative thereof; and
   output means for coupling said output of said secondary sense amplifier to an output of said memory in response to an edge of said external clock signal.

2. The memory of claim 1 further comprising restore means for holding said selected word line in said first state a predetermined time delay following an edge of said externally generated clock signal.

3. The memory of claim 1 wherein said address input means comprises:
   row buffer means for receiving and storing said row address;
   column buffer means for receiving and storing said column address; and
   control means for controlling the storage of said row and column addresses in said row and column buffer means, said control means having an external clock input, a write enable, an address input, a column enable, and a row enable inputs.

4. The memory of claim 1 wherein said output means comprises:
   data input buffer means for receiving and storing data to be stored in one of said plurality of refreshable memory cells; and
   data output buffer means for receiving and storing data to be output from said memory, said data output buffer having an output enable.

5. The memory of claim 1 further comprising:
   second clock means for providing a timing signal to said column decoder means and said restore means; and
   first clock means for providing a timing signal to said row decoder means, said restore means, and said second clock means.

6. In a memory having a plurality of bit lines; a plurality of word lines intersecting said plurality of bit lines; a plurality of refreshable memory cells coupled to respective bit and word lines at intersections thereof, each memory cell providing a signal indicative of data stored therein to said bit line to which it is coupled in response to said word line to which it is coupled being enabled; a plurality of sense amplifiers coupled to respective bit lines, each of said sense amplifiers for amplifying said signal provided by said memory cell coupled to said respective bit line; and a secondary amplifier coupled to a data line for amplifying a signal coupled thereto, a method for reading a data from said memory cells comprising the steps of:
   a) providing a write signal of a second state so that said data will be read from said memory cells;
   b) providing a column enable signal of a second state and a row enable signal of a first state;
   c) latching a row address into a row address buffer on an edge of an external clock signal while said row enable signal is in said first state and said column enable signal is in said second state;
   d) providing said column enable signal of a first state following the latching of said row address;
   e) latching a column address into a column address buffer on an edge of said external clock signal while said row and column enable signals are in said first state; and
   f) reading said data from said memory cells corresponding to said row address and said column address.

7. The method of claim 6 further comprising the step of repeating steps e and f.

8. In a memory having a plurality of bit lines; a plurality of word lines intersecting said plurality of bit lines; a plurality of refreshable memory cells coupled to respective bit and word lines at intersections thereof, each memory cell providing a signal indicative of data stored therein to said bit line to which it is coupled in response to said word line to which it is coupled being enabled; a plurality of sense amplifiers coupled to respective bit lines, each of said sense amplifiers for amplifying said signal provided by said memory cell coupled to said respective bit line; and a secondary amplifier coupled to a data line for amplifying a signal coupled thereto, a method for writing a data from said memory cells comprising the steps of:

a) providing a write signal of a first state so that said data will be written to said memory cells;

b) providing a column enable signal of a second state and a row enable signal of a first state;

c) latching a row address into a row address buffer on an edge of an external clock signal while said row enable signal is in said first state and said column enable signal is in said second state;

d) providing said column enable signal of a first state following the latching of said row address;

e) latching a column address into a column address buffer on an edge of said external clock signal while said row and column enable signals are in said first state; and f) writing said data from said memory cells corresponding to said row address and said column address.

9. The method of claim 8 further comprising the step of repeating steps e and f.

10. In a memory having a plurality of bit lines; a plurality of word lines intersecting said plurality of bit lines; a plurality of refreshable memory cells coupled to respective bit and word lines at intersections thereof, each memory cell providing a signal indicative of data stored therein to said bit line to which it is coupled in response to said word line to which it is coupled being enabled; a plurality of sense amplifiers coupled to respective bit lines, each of said sense amplifiers for amplifying said signal provided by said memory cell coupled to said respective bit line; and a secondary amplifier coupled to a data line for amplifying a signal coupled thereto, a method for reading and writing a data from said memory cells comprising the steps of:

a) providing a write signal of a second state so that said data will be read from said memory cells;

b) providing a column enable signal of a second state and a row enable signal of a first state;

c) latching a row address into a row address buffer on an edge of an external clock signal while said row enable signal is in said first state and said column enable signal is in said second state;

d) providing said column enable signal of a first state following the latching of said row address;

e) latching a column address into a column address buffer on an edge of said external clock signal while said row and column enable signals are in said first state;

f) reading said data from said memory cells corresponding to said row address and said column address;

g) providing said column enable signal of said second state and said write signal of a first state; and h) writing said data to said memory cells corresponding to said row address and said column address.

11. The method of claim 10 further comprising the step of repeating steps e through h.

12. In a memory having a plurality of bit lines; a plurality of word lines intersecting said plurality of bit lines; a plurality of refreshable memory cells coupled to respective bit and word lines at intersections thereof, each memory cell providing a signal indicative of data stored therein to said bit line to which it is coupled in response to said word line to which it is coupled being enabled; a plurality of sense amplifiers coupled to respective bit lines, each of said sense amplifiers for amplifying said signal provided by said memory cell coupled to said respective bit line; and a secondary amplifier coupled to a data line for amplifying a signal coupled thereto, a method for reading and writing a data from said memory cells comprising the steps of:

a) providing a write signal of a second state so that said data will be read from said memory cells;

b) providing a column enable signal of a second state and a row enable signal of a first state;

c) latching a row address into a row address buffer on an edge of an external clock signal while said row enable signal is in said first state and said column enable signal is in said second state;

d) providing said column enable signal of a first state following the latching of said row address;

e) latching a column address into a column address buffer on an edge of said external clock signal while said row and column enable signals are in said first state;

f) reading said data from said memory cells corresponding to said row address and said column address;

g) providing said write signal of a first state;

h) providing said column enable signal of a first state;

i) latching said column address into said column address buffer on an edge of said external clock signal; and j) writing said data to said memory cells corresponding to said row address and said column address.

13. The method of claim 12 further comprising the step of repeating steps e through j.

* * * * *